United States Patent
Naiva et al.

(10) Patent No.: US 7,031,156 B2
(45) Date of Patent: Apr. 18, 2006

(54) REDUCED PACKAGE VOLUME CONVECTIVELY COOLED SEALED ELECTRICAL SYSTEM AND METHOD

(75) Inventors: Matthew Wilbur Naiva, Wauwatosa, WI (US); John Herman Blakely, Weaverville, NC (US); Roger Alan Plemmons, Asheville, NC (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 258 days.

(21) Appl. No.: 10/626,909

(22) Filed: Jul. 25, 2003

(65) Prior Publication Data

US 2005/0018398 A1    Jan. 27, 2005

(51) Int. Cl.
  *H05K 7/20* (2006.01)
(52) U.S. Cl. .................... 361/695; 361/697
(58) Field of Classification Search ........... 361/687, 361/688, 689, 690, 692, 693, 694, 695, 697, 361/702, 703, 709, 710, 711; 454/184, 185, 454/186; 165/80.3, 80.4, 104.34
  See application file for complete search history.

(56) References Cited

U.S. PATENT DOCUMENTS

| | | | | |
|---|---|---|---|---|
| 3,909,679 A | * | 9/1975 | Petri ..................... | 361/710 |
| 4,233,645 A | * | 11/1980 | Balderes et al. ........... | 361/698 |
| 4,707,726 A | * | 11/1987 | Tinder .................... | 174/252 |
| 4,833,567 A | * | 5/1989 | Saaski et al. .............. | 361/700 |
| 4,897,764 A | * | 1/1990 | Bruchmann et al. ........ | 361/705 |
| 5,138,523 A | * | 8/1992 | Benck et al. .............. | 361/687 |
| 5,175,613 A | * | 12/1992 | Barker et al. .............. | 257/713 |
| 5,212,627 A | * | 5/1993 | No ........................ | 361/715 |
| 5,305,184 A | * | 4/1994 | Andresen et al. .......... | 361/699 |
| 5,323,292 A | * | 6/1994 | Brzezinski ................ | 361/689 |
| 6,043,981 A | * | 3/2000 | Markow et al. ........... | 361/704 |
| 6,463,743 B1 | * | 10/2002 | Laliberte ................. | 62/3.3 |
| 6,493,227 B1 | * | 12/2002 | Nielsen et al. ............ | 361/703 |
| 6,563,049 B1 | * | 5/2003 | May ...................... | 174/59 |
| 6,741,466 B1 | * | 5/2004 | Lebo ...................... | 361/687 |
| 2002/0131237 A1 | * | 9/2002 | Snyder et al. ............. | 361/719 |

* cited by examiner

Primary Examiner—Lisa Lea-Edmonds
Assistant Examiner—Ingrid Wright
(74) Attorney, Agent, or Firm—Patrick S. Yoder; Alexander M. Gerasimow

(57) ABSTRACT

A sealed modular control and monitoring system is provided which affords location of electrical control and monitoring components adjacent to an application. The system comprises modular components which are mounted on a shared thermal base. The base is sealed to the components and presents thermal exchange features on interior and exterior surfaces thereof. Forced convection within the modular system is afforded by a circulating fan that directs air through the component circuitry and adjacent to the thermal base to remove heat from the circuitry during operation.

28 Claims, 4 Drawing Sheets

REDUCED PACKAGE VOLUME CONVECTIVELY COOLED SEALED ELECTRICAL SYSTEM AND METHOD

BACKGROUND OF THE INVENTION

The present invention relates generally to the field of electrical devices, such as for instrumentation and control applications. The invention particularly relates to a technique for providing enhanced thermal transfer within and from a sealed enclosure of the type used in modular industrial equipment.

Many applications exist for instrumentation and control devices, particularly in industrial settings. Such settings may include manufacturing operations, mining operations, material handling, transportation, natural resource exploitation, agricultural and food processing, to mention just a few. In conventional approaches to such systems, centralized locations have been provided at which various types of control and monitoring equipment will be interconnected and housed. Where environmental conditions require isolation of the components from the environment, enclosures and housings have typically been built to support and protect the components. Such system architectures, however, have inherent drawbacks. For example, power and data signals, where the equipment is controlled or monitored via networks, must be routed to and from actuators, sensors, motors, and so forth by means of cabling running between the centralized enclosures and the actual equipment. Moreover, centrally locating all components may be quite difficult, and troubleshooting, servicing, repair and replacement of components may require sharing of time between the equipment or application location and the centralized enclosures.

Approaches have been developed in response to such drawbacks whereby components are interconnected and located in a more distributed fashion. That is, control and monitoring equipment may be positioned in a more closely associated fashion to the ultimate application, with sensors, actuators, prime movers, and so forth being simply interconnected with the control and monitoring equipment thus distributed throughout the machine or application. While not providing a centralized enclosure or architecture for assembly and servicing, such approaches have the benefit of allowing close placement of the control and monitoring equipment to the application, facilitating interconnection with the controlled or monitored equipment, and allowing for servicing in a closing adjacent physical setting.

System architectures providing such distributed control and monitoring functions come with additional challenges, however. For example, the control and monitoring components, now removed from the protective central enclosures, must be capable of withstanding the sometimes harsh environments of the final application. Such environmental conditions may include exposure to significant variations in temperature, chemically corrosive atmospheres, dusty or dirty air, and precipitation and humidity, in addition to washdowns which are required or can occur in certain settings. These conditions tend to require that the control and monitoring components be sealed in a component housing or structure. Depending upon the type of components thus housed, removal of heat generated during operation may become a significant obstacle to system design and operation. Moreover, the modularity affordable through the use of centralized enclosures is somewhat lost in conventional approaches to distributed control and monitoring insomuch as the components must be interconnected and interfaced with one another to provide the desired operability, protection, and termination.

There is a significant need in the art for improved techniques for sealed electrical component and system design. In particular, there is a need for component packaging solutions which provide for sealed housings which can be cooled to efficiently eliminate heat generated during operation of the control and monitoring components. There is a similar significant need for thermally managed and sealed electrical component housings which afford some degree of modularity in the selection, assembly and interconnection of various system components, including motor starters, protective circuitry, input/output components and circuitry, inverter drives, and so forth.

SUMMARY OF THE INVENTION

The present invention provides a novel technique for component and system design which responds to such needs. The technique may find application in a wide range of fields, but is particularly well-suited to industrial automation and control. The technique is based upon construction of a sealed housing which may incorporate one or more modular components assembled on a shared thermal base. The components share an interior volume from which heat is to be transferred during operation. Circulation of air is afforded within the volume so as to convectively transfer heat from components during operation to interior heat dissipation features which are integral with the base. Additional heat transfer features are integral with the base on an outer surface thereof. Thus, by forced convection within the modular component housing heat is transferred to the base and therefrom, maintaining a desired degree of cooling for the various components within the modular arrangement. The base is also preferably designed to operate in a natural convection mode within the sealed assembly, including for flow of cooling air in different directions, further adding to the versatility of the design. Furthermore, the features of the base preferably accommodate a range of component types and sizes such that different systems may be assembled on a reduced number of separate bases.

The solution offered by the present technique is particularly attractive for applications in which a sealed enclosure is required and in which the components within the enclosure generate significant heat not conductively coupled to the heat dissipation features of the enclosure during operation. That is, the technique is well suited for applications in which heat is released into a sealed internal air volume and not to a surface of an element in contact with the environment to which heat it to be transferred. For example, in one application various circuitry is interconnected within a modular structure that shares a thermal base, the circuitry including a disconnect, input/output components, and a motor drive, particularly drives that are apt to generate considerable heat loads, such as soft starters and inverter drives, or other switched devices employing solid state switching. During operation of the inverter drive significant heat is generated which is dissipated into the sealed housing. A plenum within the modular housing aids in directing a flow of air within the internal volume across raised thermal transfer elements of the thermal base. Heat is thus conducted away from the drive circuitry and to the thermal base. The thermal base then presents integral features on outer surface thereof which aid employ natural convection or other heat transfer modes to transfer the heat away from the entire sealed unit. Thus, significant heat is transferred away from the unit during operation, while providing a sealed package which can withstand harsh environmental conditions possible at the application location. The balanced thermal impedance of internal and external features of the base convectively couple the heat wasted into the sealed environment to the exterior environment and afford greater commensurate heat ejection capabilities given the limited space occupied by these features. Thus, the technique employed allows a significant package size reduction and cooler steady state operation of the sealed power handling equipment.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Figure 1:
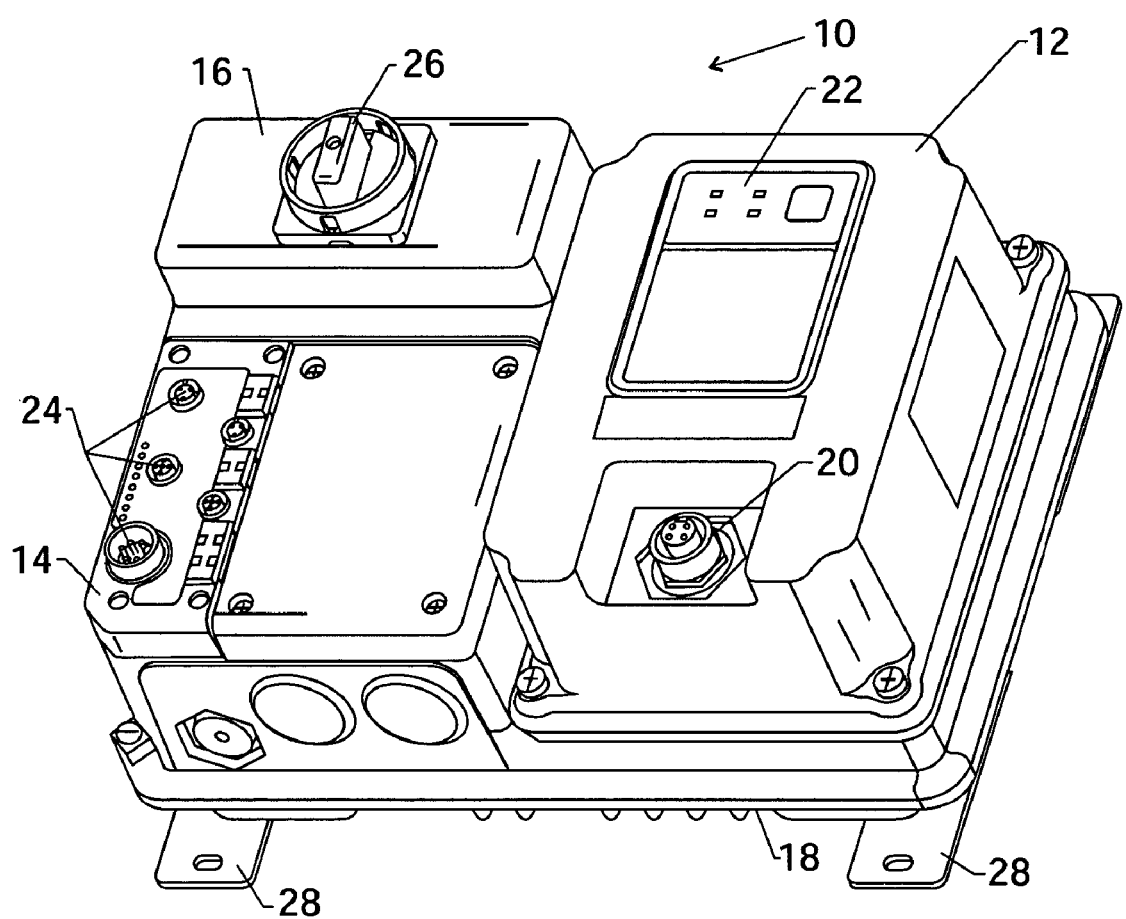
FIG. 1 is a perspective view of an exemplary modular distributed control and monitoring system in accordance with aspects of the present technique.

Referring first to FIG. 1, a modular distributed control and monitoring system is illustrated and designated generally by the reference numeral 10. The system may include one or a plurality of modular units or components, with several such components being illustrated in the embodiment of FIG. 1. As shown in FIG. 1, these components include a switch module 12, which itself may include a variety of circuitry. In a present embodiment, for example, the switch module 12 may include a motor starter, such as an across-the-line starter or a soft starter. Similarly, switch module 12 may include an inverter drive, which, as will be appreciated by those skilled in the art, may generate significant heat during operation. Such inverter drives typically include an array of solid state switches, such as insulated gate bipolar transistors, which are switched at high frequencies to provide variable frequency AC output. Other components which may generate such loads may include a range of devices employing solid state switches, such as soft starters and so forth. Due to the significant heat loads generated by the components during operation, the system 10 is designed to extract heat from the circuitry not conductively coupled to an external heat sink as discussed in greater detail below.

In addition to switching module 12, the exemplary modular system of FIG. 1 includes an input/output module 14, and a wiring module 16. The input/output module 14 provides terminals, interconnections, and so forth for receiving both power and data signals from remote circuitry, such as centralized control circuitry, sensors and actuators, and for transmitting such data to the remote circuitry. The input/output module 14 may also afford interconnection to monitoring equipment such as laptop computers, human interface modules and the like (not shown). The wiring module 16 receives input power from a source (such as an electrical grid) and transmits output power to a load, typically local to the placement of system 10. In a motor drive application, for example, output power from the switching module 12 is transmitted via a wiring connector 20 to drive the motor at a fixed speed or at variable speeds (i.e. output frequencies), depending upon the degree of control desired and the nature of the circuitry within the switching module 12.

The switching module, the input/output module and the wiring module share a common thermal base 18. The thermal base is designed to receive one or more such components, to support the components and to transfer heat from the components during operation, as discussed in greater detail below. As also discussed below, the thermal base provides an interface for sealing an interior volume upon mounting the various modules on the base. Thus, the modular system 10, in addition to providing multiple modular functions as required by the application, affords a sealed package from which heat may be transferred from multiple modules during operation.

Considering the illustrated components of system 10 in somewhat greater detail, in the illustrated embodiment, data is communicated via internal connections (not shown) with switching module 12, allowing for the exchange of signals, status data, error logs, and so forth with the wiring module 16. A local control interface 22 is also provided on the module, which may allow for various functions, such as resetting circuitry, enabling or disabling circuitry, configuring or calibrating circuitry, stepping through menus for such functions, and so forth. Similarly, the illustrated input/output module 14 includes multi-pin interconnections 24 for receiving and transmitting signals to and from remote circuitry, such as sensors and actuators. Wiring module 16 will typically include sealed ports (not shown) for receiving and transmitting power. Other features may be included in the wiring module 16, such as manual switch gear, exemplified by the rotary disconnect 26 in the embodiment of FIG. 1. Such components may, of course, provide for tagging, lockout, and other functions as required by the application and the eventual servicing needs.

Figure 2:
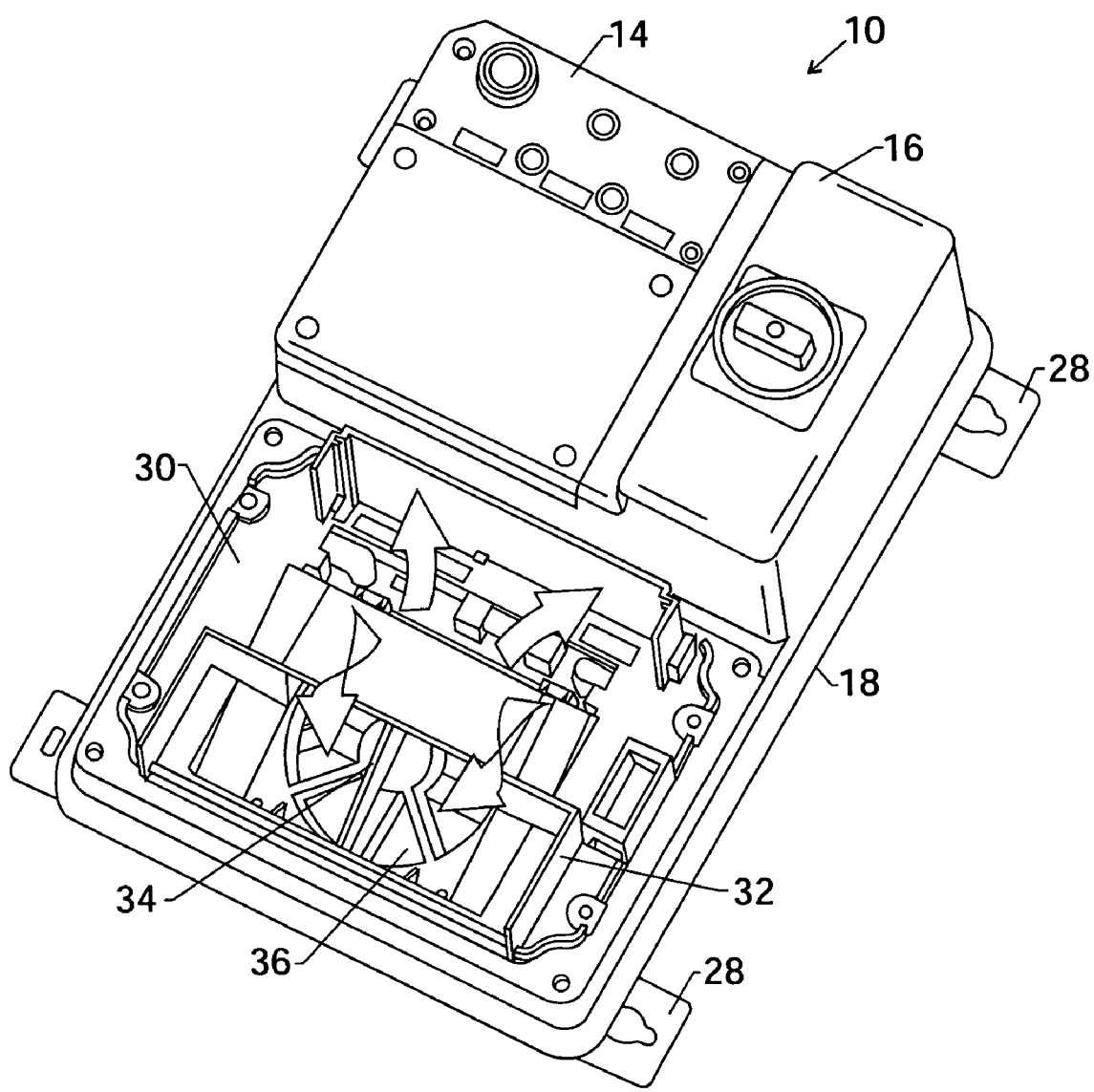
FIG. 2 is a perspective view of the system of FIG. 1 from which one of the modular components has been removed to show the internal plenum and fan for circulating air within the enclosure for removal of heat via a thermal base.

Modular system 10 is designed to be positioned at or near an application location, such as on a machine structure. The sealed enclosure provided by thermal base 18 may be thus exposed to the same environment or conditions as the load in the application. The system provides for thermal transfer to the environment by means of integral features provided on the thermal base 18. In a present embodiment illustrated in the figures, the thermal base also facilitates mounting of the system on the machine structure. As illustrated in FIGS. 1 and 2, for example, mounting feet 28 may be secured to the thermal base for hanging or otherwise mounting the system at the desired location.

FIG. 2 illustrates the system 10 described above with a portion of the system removed to expose an exemplary internal configuration which facilitates heat extraction during operation. In particular, in the view of FIG. 2, the switching module 12 shell and components have been removed to expose part of the internal volume shared by the various components. This interior volume, indicated generally by reference numeral 30 in FIG. 2, will include air spaces which are generally contiguous with one another, and which may extend through one or more of the various interconnected and sealed modules, and through a shared region immediately adjacent to the thermal base 18. Various structures may be provided in the circuitry itself, in the housing of the various modules, and within the overall structure for directing the flow of air within the internal volume for removal of heat. In the embodiment illustrated in FIG. 2, for example, a plenum 32 is provided for drawing heat from the switching module and for returning air to the switching module for a continuous heat removal. A fan 34 is positioned at a base of the plenum to draw air from the switching module and to direct the air across a lower volume 36 which extends over the thermal base. Cooled air returning from the thermal base is then redirected to the switching module as illustrated generally by the arrows in FIG. 2.

Figure 3:
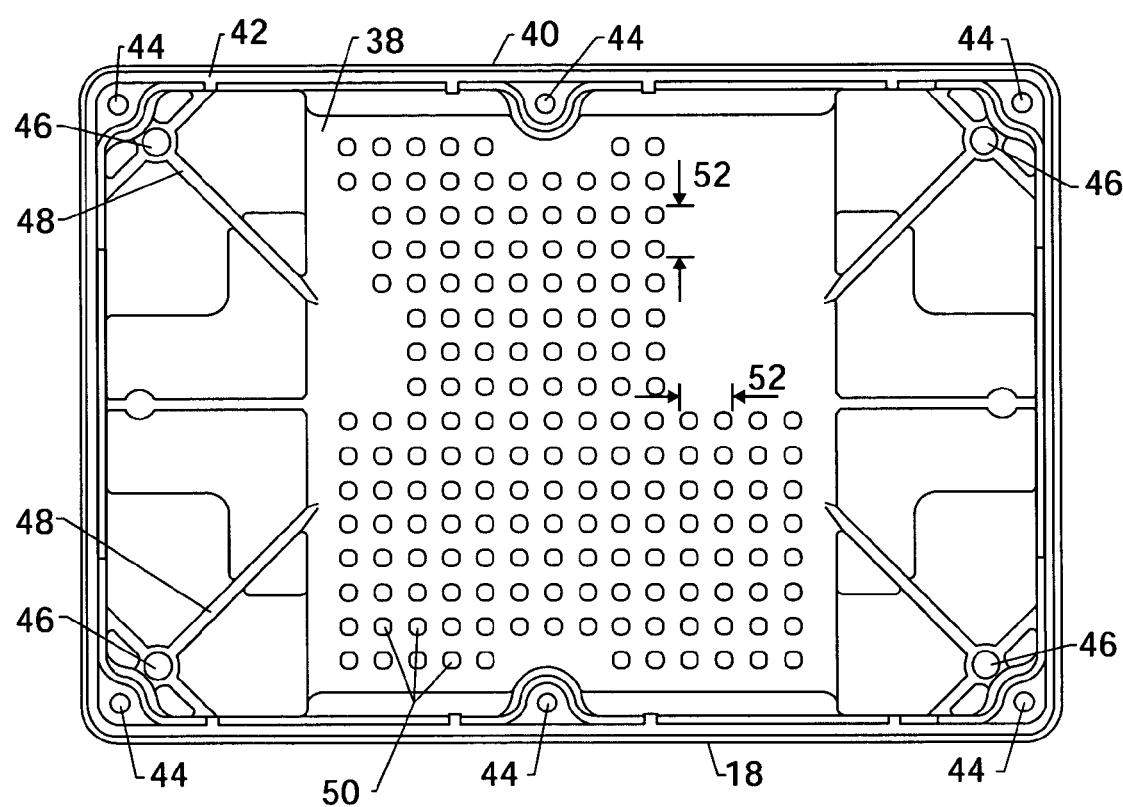
FIG. 3 is a plan view of the interior surface of an exemplary thermal base for use in the system of FIGS. 1 and 2, illustrating heat transfer features integral within the base.

Referring to FIG. 3, the various modular components mounted on the thermal base and described above have been removed to illustrate an exemplary configuration of the thermal base. As noted above, the thermal base is designed to provide a sealed enclosure, to support multiple modular components, and to afford enhanced convective thermal transfer from the enclosure to the outside environment during operation. In a present configuration, multiple systems may be designed and assembled on standard sizes of thermal bases, thereby providing for considerable flexibility in component selection and interconnection, while reducing the number of separate thermal bases required for the various system designs. In the embodiment illustrated in FIG. 3, an inner surface 38 of the thermal base 18 is designed to be exposed to the volume 36 between the thermal base and the modular components, as noted above with reference to FIG. 2. The inner surface 38 is surrounded by a peripheral flange 40 adjacent to which a seal groove 42 is formed. The seal groove allows for receiving a seal, such as an elastomeric gasket, which seals with the various modular components during assembly of the system. Apertures 44 are provided for receiving fasteners (not shown) used to secure the modular components to the thermal base. Similar blind fastener locations 46 are provided at which mounting structures, such as the feet 28 illustrated in FIGS. 1 and 2, may be secured. The interior features of the thermal base may include a series of ribs or struts 48 which enhance the structure integrity of the base, particularly at locations where the base is secured to supporting structures.

As noted above, the thermal base provides for convective heat transfer to the environment during operation of the modular components. Accordingly, in a present embodiment, the thermal base is made of a highly thermally conductive material, such as aluminum, and incorporates all of the features described in a single integral structure. The thermal base may, of course, include an assembly of parts, although the integral inclusion of the thermal transfer features is desired to afford simplicity in manufacturing and efficient heat transfer. In the illustrated embodiment, for example, raised pins 50 are provided on the inner surface 38 of the thermal base. The pins are raised from the base a sufficient height to increase the surface area of the thermal base exposed to the circulation of air within the sealed enclosure. In the illustrated embodiment, the raised pins 50 are spaced from one another by an inner spacing 52 which defines rows and columns of pins. Alternative configurations may, of course, be employed, such as fins, ribs, various flow-defining paths, and various geometrical arrangements of pins or fans. In general, however, the integral heat dissipating elements within the thermal base provide for enhanced convective heat transfer from the air within the internal volume of the enclosure to the material of the thermal base.

As noted above, the thermal base may be designed for operation in both forced and natural convective modes of heat transfer. In particular, in the illustrated embodiment, the use of pins on the inner surface of the base facilitates forced convection in the direction of air flow from the fan 34 (see FIG. 2), and also allows for convective heat transfer by induced flows in other directions (e.g. perpendicular to the direction of air flow from the fan). That is, in certain applications, the fan may be eliminated and the same base utilized for natural convection that will occur within the sealed unit.

Figure 4:
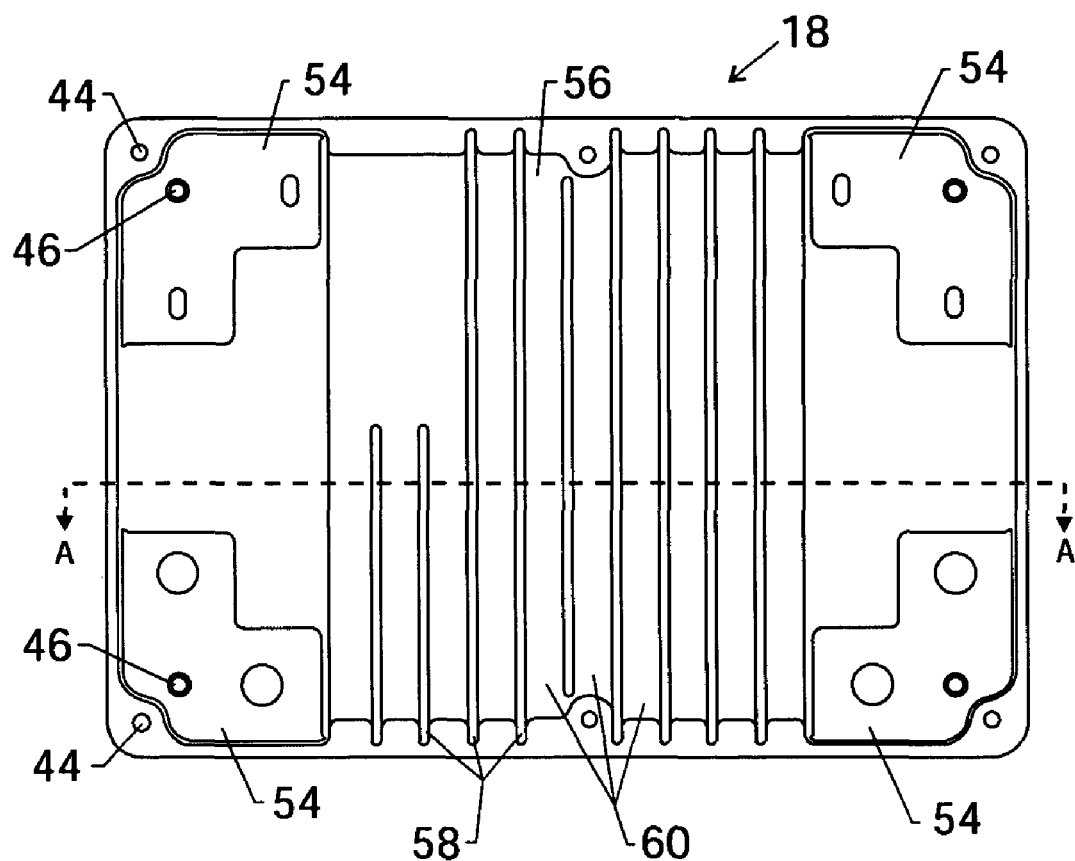
FIG. 4 is a plan view of an external surface of the thermal base of FIG. 3 illustrating additional thermal transfer features on the outer surface of the unit.

As illustrated in FIG. 4, the thermal base also includes exterior features which are integral to the base and which further enhance the transfer of heat from the sealed system. In particular, to facilitate mounting of the thermal base, while allowing for removal of heat by convective means, the thermal base 18 presents raised corners 54 in which the blind fastener locations 46 are provided. The raised corners thus allow the entire structure to be mounted on a machine surface, while permitting the flow of air between the thermal base and the supporting machine structure. A heat exchange area 56 is thus defined between the raised corners. In the embodiment illustrated in the figures, ribs 58 are formed in the heat exchange area 56. The ribs extend from one side of the thermal base to the other, so as to define air passages 60 therebetween. As noted above with respect to the raised pins 50 on the inner surface of the thermal base, alternative heat dissipating elements may, of course, be envisaged for the thermal base outer surface. For example, differently shaped, spaced or oriented ribs may be provided, or the ribs may be replaced by other structures, as raised pins, and so forth. In general, however, the outer surface will include such integral heat dissipation features which can be readily exposed for the circulation of cooling air, while permitting the base to be mounted on a supporting structure.

Figure 5:
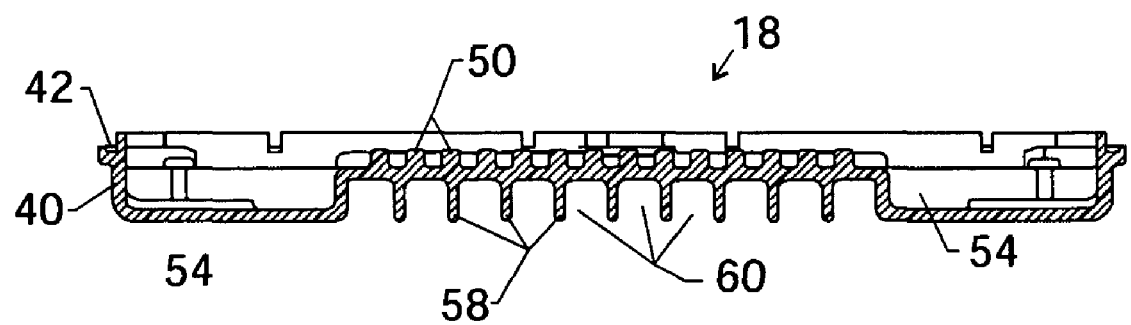
FIG. 5 is a sectional view through the thermal base of FIGS. 3 and 4 taken along line A—A of FIG. 4 illustrating the various features of the thermal base conducive to conveying heat from the system during operation.

The various features of the thermal base 18 described above are illustrated together in the sectional view of FIG. 5. As noted above, the inner surface of the thermal base 18 presents raised pins 50 which are integral with the base material, and are immediately adjacent to the ribs 58 on the outer surface of the base. The pins extend to a height which permits forced convective heat transfer from air circulated through the inner circulation volume adjacent to the thermal base when the system 10 is assembled as described above. Thus, air circulating over the base by virtue of the operation of the fan described above transfers heat to the raised pins and, by conduction of the base material, to the ribs 58. The passages 60 are defined between the ribs and remain exposed to circulation of cooling air by virtue of the raised corners 54. Finally, the seal groove 42 is illustrated as surrounding the thermal base to permit the base to be completely sealed to the modular components mounted thereon.

The resulting structure provides a high degree of modularity, permitting various components and systems to be assembled, depending upon the application requirements. The components are furthermore sealed to the base, allowing for placement of the assembled system in harsh environments. Moreover, within sealed volume of the system, circulated air extracts heat from the components, particularly those apt to generate significant heat loads during operation, that are then transferred to the thermal base for dissipation via its integral convective heat transfer elements.

As noted above, the design of the features defining convective thermal transfer elements on the inner and outer surfaces of the thermal base may vary from those shown. Also, the design of the features will generally consider their relative thermal impedance such that the anticipated heat loads can be efficiently transferred from the unit, while providing an extremely compact sealed design. The shape, size, configuration and layout of the features will typically depend upon factors such as the anticipated temperatures, the anticipated air flow, whether the internal volume and exterior environment will operate in forced or natural convection modes, the direction or directions of air flow within the internal volume and external environment.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A reduced package volume electrical control or monitoring system comprising:
   at least one electrical component configured to be coupled to external circuitry for controlling or monitoring an electrical load, the at least one electrical component having a first inner volume;
   a thermal base sealed to the at least one electrical component to define a second inner volume generally parallel and immediately adjacent to the thermal base, the thermal base being made of a thermally conductive material and presenting a plurality of convective heat transfer elements on both inner and outer surfaces thereof; and
   an air circulation system for forcing a flow of air within the system between the first and second inner volumes to dissipate heat generated by the at least one component during operation via the thermal base.

2. The system of claim 1, comprising a plurality of components interconnected with one another, and wherein the air circulation system forces the flow of air to dissipate heat generated by more than one of the components during operation.

3. The system of claim 1, wherein the air circulation system includes a fan and a plenum directing the flow of air between the first inner volume and the second inner volume.

4. The system of claim 1, wherein the plurality of convective heat transfer elements on the inner surface of the thermal base includes pins extending from the base into the second inner volume.

5. The system of claim 1, wherein the plurality of convective heat transfer elements on the outer surface of the base includes fins extending from the base.

6. The system of claim 5, wherein the fins extend into a recessed heat transfer region bounded by one or more mounting areas.

7. The system of claim 1, wherein the plurality of convective heat transfer elements on the inner and outer surfaces of the thermal base are integral to the base.

8. The system of claim 1, wherein the at least one electrical component includes an inverter drive.

9. The system of claim 1, wherein the thermal base includes a seal for sealing the first inner and outer volumes within the system.

10. The system of claim 1, wherein the thermal base includes integral mounting surfaces for supporting the system in service.

11. A modular electrical control or monitoring system comprising:
   a plurality of modular electrical components interconnected with one another and configured to be coupled to external circuitry for controlling or monitoring an electric motor, at least one of the electrical components having a first inner volume;
   a thermal base sealed to the modular electrical components to define a second inner volume generally parallel and immediately adjacent to the thermal base, the thermal base being made of a thermally conductive material and presenting a plurality of convective heat transfer elements on both inner and outer surfaces thereof; and
   an air circulation system including a fan and a plenum for directing a flow of air within the system between the first and second inner volumes to dissipate heat generated by the modular components during operation via the thermal base.

12. The system of claim 11, wherein the plurality of convective heat transfer elements on the inner surface of the thermal base includes pins extending from the base into the second inner volume.

13. The system of claim 11, wherein the plurality of convective heat transfer elements on the outer surface of the base includes fins extending from the base.

14. The system of claim 13, wherein the fins extend into a recessed heat transfer region bounded by one or more mounting areas.

15. The system of claim 11, wherein the plurality of convective heat transfer elements on the inner and outer surfaces of the thermal base are integral to the base.

16. The system of claim 11, wherein the at least one modular electrical component includes an inverter drive.

17. A modular electrical control or monitoring system comprising:
   a plurality of modular electrical components interconnected with one another and configured to be coupled to external circuitry for controlling or monitoring an electric motor, the electrical components including at least an inverter drive having a first inner volume;
   a thermally conductive base sealing secured to the plurality of modular electrical components to define a second inner volume immediately adjacent to an inner surface of the base, a plurality of mounting surfaces for supporting the base and the plurality of electrical components in service, and a plurality of integral convective heat transfer elements extending from both inner and outer surfaces thereof from transferring heat from the second inner volume to the environment surrounding the thermal base; and
   an air circulation system including a fan and a plenum for directing a flow of air within the system between the first and second inner volumes to dissipate heat generated by the inverter drive during operation via the thermal base.

18. A modular electrical control or monitoring system comprising:
   a plurality of modular electrical components interconnected with one another and configured to be coupled to external circuitry for controlling or monitoring an electric motor, the electrical components including at least an inverter drive having a first inner volume;
   a thermally conductive base sealing secured to the plurality of modular electrical components to define a second inner volume immediately adjacent to an inner surface of the base, a plurality of mounting surfaces for supporting the base and the plurality of electrical components in service, and a plurality of integral convective heat transfer elements extending from both inner and outer surfaces thereof from transferring heat from the second inner volume to the environment surrounding the thermal base, the plurality of integral convective heat transfer elements including a plurality of pins extending into the second inner volume and a plurality of fins disposed between mounting surfaces on the outer surface of the base; and an air circulation system including a fan and a plenum for directing a flow of air within the system between the first and second inner volumes to dissipate heat generated by the inverter drive during operation via the thermal base.

19. A modular electrical control or monitoring system comprising:

a thermally conductive base having a seal groove configured to receive a seal for sealing the base to a plurality of modular electrical components, a plurality of mounting surfaces for supporting the base and the plurality of electrical components in service, and a plurality of integral convective heat transfer elements extending from both inner and outer surfaces thereof for transferring heat from a sealed inner volume directly adjacent to the inner surface thereof to the environment surrounding the thermal base, wherein the plurality of convective heat transfer elements on the outer surface of the base includes fins extending from the base into a recessed heat transfer region bounded by one or more mounting areas.

20. The system of claim 19, wherein the plurality of convective heat transfer elements on the inner surface of the thermal base includes pins extending from the base into the sealed inner volume.

21. A reduced package volume electrical control or monitoring system comprising:

at least one electrical component configured to be coupled to external circuitry for controlling or monitoring an electrical load, the at least one electrical component having a first inner volume;

a thermal base sealed to the at least one electrical component to define a second inner volume generally parallel and immediately adjacent to the thermal base, the thermal base being made of a thermally conductive material and presenting a plurality of convective heat transfer elements on both inner and outer surfaces thereof, the convective heat transfer elements on the inner surface of the thermal base being configured to provide convective heat transfer in both forced and natural convection modes, whereby air within the system is exchanged between the first and second inner volumes to dissipate heat generated by the at least one component during operation via the thermal base.

22. The system of claim 21, wherein the convective heat transfer elements on the inner surface of the thermal base are configured to provide for air flow in a plurality of different directions.

23. The system of claim 22, wherein the convective heat transfer elements on the inner surface of the thermal base include a plurality of pins forming columns and rows in transverse directions.

24. A method for controlling or monitoring an electrical load comprising:

disposing a plurality of electrical components on a thermal base, at least one of the electrical components including a first inner volume, the thermal base being sealed to the plurality of electrical components to define a second inner volume generally parallel and immediately adjacent to the thermal base, the thermal base being made of a thermally conductive materials and presenting a plurality of convective heat transfer elements on both inner and outer surfaces thereof; and circulating air between the first and second inner volumes to dissipate heat generated by the at least one modular component during operation via the thermal base.

25. The method of claim 24 wherein air is circulated between the first and second inner volumes by a fan and directed to the second inner volume by a plenum disposed at least partially around the fan.

26. The method of claim 24 wherein the plurality of convective heat transfer elements on the inner surface of the thermal base includes pins extending from the base into the second inner volume.

27. The method of claim 24, wherein the plurality of convective heat transfer elements on the outer surface of the base includes fins extending from the base.

28. The method of claim 27, wherein the fins extend into a recessed heat transfer region bounded by one or more mounting areas.

* * * * *